(12) United States Patent
Matsuda

(10) Patent No.: US 10,233,322 B2
(45) Date of Patent: Mar. 19, 2019

(54) UV-CURABLE ORGANOPOLYSILOXANE COMPOSITION, SILICONE GEL CURED PRODUCT, AND PRESSURE SENSOR

(71) Applicant: SHIN-ETSU CHEMICAL CO., LTD., Tokyo (JP)

(72) Inventor: Tsuyoshi Matsuda, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/843,487

(22) Filed: Sep. 2, 2015

(65) Prior Publication Data

US 2016/0075869 A1    Mar. 17, 2016

(30) Foreign Application Priority Data

Sep. 12, 2014 (JP) .................................. 2014-186266

(51) Int. Cl.
| | | |
|---|---|---|
| C08L 33/14 | (2006.01) | |
| C08F 299/08 | (2006.01) | |
| C08L 83/04 | (2006.01) | |
| C08L 83/08 | (2006.01) | |
| C08G 77/20 | (2006.01) | |
| C08G 77/24 | (2006.01) | |
| H01L 23/29 | (2006.01) | |

(52) U.S. Cl.
CPC ............ *C08L 33/14* (2013.01); *C08F 299/08* (2013.01); *C08L 83/04* (2013.01); *C08L 83/08* (2013.01); *C08G 77/20* (2013.01); *C08G 77/24* (2013.01); *H01L 23/296* (2013.01); *H01L 2924/0002* (2013.01)

(58) Field of Classification Search
CPC .......... C08L 33/14; C08L 83/08; C08L 83/04; C08F 299/08; H01L 2924/0002; H01L 23/296; C08G 77/20; C08G 77/24
See application file for complete search history.

(56) References Cited

U.S. PATENT DOCUMENTS

| | | | | |
|---|---|---|---|---|
| 5,212,211 A | * | 5/1993 | Welch, II ............... | C08G 77/50 522/172 |
| 5,494,979 A | * | 2/1996 | Ebbrecht ................ | C08G 77/20 522/99 |
| 5,532,294 A | * | 7/1996 | Ikeno ..................... | C08K 9/06 523/212 |
| 6,451,870 B1 | * | 9/2002 | DeCato .................. | C08J 3/243 522/33 |
| 8,367,212 B2 | | 2/2013 | Irifune | |
| 9,534,069 B2 | * | 1/2017 | Woo ....................... | C08G 77/20 |
| 2002/0035199 A1 | * | 3/2002 | Breunig ................. | C08G 59/245 524/588 |
| 2004/0106761 A1 | | 6/2004 | Zha et al. | |
| 2006/0134173 A1 | | 6/2006 | Liu et al. | |
| 2015/0166458 A1 | | 6/2015 | Hase et al. | |

FOREIGN PATENT DOCUMENTS

| | | |
|---|---|---|
| EP | 0455585 A1 | 11/1991 |
| EP | 1 870 735 A1 | 12/2007 |
| JP | 5-70546 A | 3/1993 |
| JP | 7-216232 A | 8/1995 |
| JP | 2001-64593 A | 3/2001 |
| JP | 2005-40749 A | 2/2005 |
| JP | 3894873 B2 | 3/2007 |
| JP | 2008-195931 A | 8/2008 |
| JP | 2008-210845 A | 9/2008 |
| JP | 2013-253166 A | 12/2013 |

(Continued)

OTHER PUBLICATIONS

Takei et al., machine English translation of JP 2008-210845 (Sep. 11, 2008).*
Kosakai et al., machine English translation of JP 07-216232 (Aug. 15, 1995).*
Extended European Search Report dated Oct. 28, 2015, in European Patent Application No. 15182747.4.
Japanese Office Action dated Oct. 24, 2017, for corresponding Japanese Application No. 2014-186266.

*Primary Examiner* — Jessica M Roswell
(74) *Attorney, Agent, or Firm* — Birch, Stewart, Kolasch & Birch, LLP

(57) ABSTRACT

A UV curable organopolysiloxane composition includes:
(A) a linear or branched organopolysiloxane having the following formula (1):

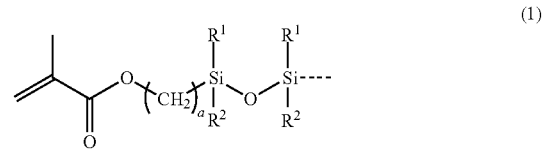

wherein $R^1$ and $R^2$ independently represent a monovalent hydrocarbon group, "a" is an integer of 1 to 3, and a chain line indicates a bond;

(B) a linear or branched organopolysiloxane represented by the following formula (2):

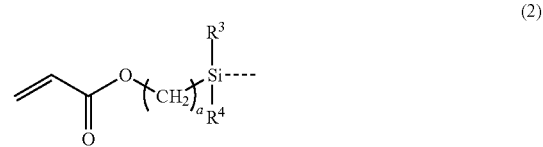

wherein $R^3$ and $R^4$ independently represent a monovalent hydrocarbon group, "a" is as defined above, and a chain line indicates a bond; and (C) a photoinitiator.

6 Claims, No Drawings

(56) References Cited

FOREIGN PATENT DOCUMENTS

| WO | WO 99/67318 A1 | 12/1999 | | |
|---|---|---|---|---|
| WO | WO 00/22460 A1 | 4/2000 | | |
| WO | WO 01/83568 A1 | 11/2001 | | |
| WO | WO 2014-109455 | * | 7/2014 | ............. C08G 77/20 |

* cited by examiner

UV-CURABLE ORGANOPOLYSILOXANE COMPOSITION, SILICONE GEL CURED PRODUCT, AND PRESSURE SENSOR

CROSS-REFERENCE TO RELATED APPLICATION

This non-provisional application claims priority under 35 U.S.C. § 119(a) on Patent Application No. 2014-186266 filed in Japan on Sep. 12, 2014, the entire contents of which are hereby incorporated by reference.

TECHNICAL FIELD

This invention relates to an ultraviolet (UV)-curable organopolysiloxane composition that is excellent in curability over a wide range of UV irradiance and is also excellent in surface curability and depth curability. More particularly, the invention relates to a UV-curable organopolysiloxane composition and a silicone gel cured product obtained by curing the composition, which is excellent in resistance to oxygen inhibition and is capable of stably yielding, in the presence of oxygen, a cured silicone gel (gel cured product) with a substantially definite crosslinking density (or a substantially definite rate of penetration) irrespective of the UV irradiation level (or the amount of irradiated energy). The invention also relates to a pressure sensor using the cured product.

BACKGROUND ART

Simplification and cost reduction in production processes have been in positive progress coupled with an eco-friendly low energy orientation. Especially, production processes of optical, electric and electronic devices and displays mostly involve high temperature heating steps requiring vast amounts of energy, time and equipment so as to cure adhesive, sealing and embedding materials, thus requiring improvement. This improvement for the heating steps has great meaning not only for energy and cost but also for production techniques of not damaging other materials.

Recently, in order to solve these problems, attention has been paid to UV-curable compositions. The UV-curable composition contains photoinitiators that can be activated by UV irradiation, whereby polymerization or crosslinking reaction proceeds to permit curing within a short time of several tens of seconds to ten and several minutes. For this, other members are hardly damaged, and no large-sized equipment is necessary. In recent years, UV irradiators making use of light emitting diodes (LEDs) have been developed, whereby excellent production processes have been performed.

With regard to the UV curable silicone compositions, a method using photocationic polymerization (see Patent Document 1: JP-A 2008-195931), and a method using radical polymerization (see Patent Document 2: JP 3894873) have been proposed. In the former method, an onium salt capable of generating an acid by UV irradiation is contained in the composition. If the composition is used on an electric or electronic substrate, there may be some concern that the substrate undergoes corrosion. The latter method has a feature in that the reaction velocity becomes high owing to high reaction activity and thus curing is achieved within a short time. However, the radicals have a very short life and are readily deactivated with oxygen. Eventually, curability on the composition surface in contact with air may considerably lower.

To cope with the above-described problem on cure inhibition, a variety of sensitizers have been studied as an additive (see, for example, Patent Document 3: JP-A 2001-064593, Patent Document 4: JP-A 2005-040749, and Patent Document 5: JP-A 2013-253166).

In the method described in Patent Document 3, some kind of amine compounds is added as an additive so as to impart basicity thereby enhancing reactivity of a photoinitiator or (meth)acrylate double bond. In the method described in Patent Document 4, an anthracene derivative or xanthone derivative having a high molar absorbance coefficient over a wide range of wavelengths is allowed to coexist thereby enabling a higher excitation energy to be released from irradiation light.

The method described in Patent Document 5 makes use, as a curing sensitizer, of a (meth)acrylate obtained from an alcohol having one or more hydroxyl groups and two or more oxygen atoms in the molecule so as to enhance polymerization reactivity.

However, in the methods of Patent Documents 3 to 5, although the respective reactivities can be improved, storage stability becomes worsened with the problem that curing gradually proceeds in sensitizer-coexisting conditions even in cold and dark storage. Moreover, where an amine compound is added as an additive, a problem is involved in its discoloration. With the anthracene derivative or (meth)acrylate described in Patent Document 5, a problem is that its solubility in silicones is low.

CITATION LIST

Patent Document 1: JP-A 2008-195931
Patent Document 2: JP 3894873
Patent Document 3: JP-A 2001-064593
Patent Document 4: JP-A 2005-040749
Patent Document 5: JP-A 2013-253166

DISCLOSURE OF THE INVENTION

It is an object of the present invention to provide a UV curable organopolysiloxane composition that is excellent in curability over a wide range of UV illuminance and also in surface curability and deep curability. Another object of the invention is to provide a UV curable organopolysiloxane composition that exhibits an excellent resistance to oxygen inhibition when subjected to UV irradiation and is capable of stably yielding, in the presence of oxygen, a silicone gel (gel cured product) cured to a substantially definite level of crosslinking density (a substantially definite rate of penetration) irrespective of UV irradiance (irradiation energy amount). A further object of the invention is to provide a silicone gel cured product obtained from the composition and also a pressure sensor using the cured product.

We have made intensive studies so as to achieve the above objects. As a result, we have found that when using, as a reactive diluent, a low-molecular-weight (low viscosity) organopolysiloxane having at least two acryloxyalkyl group-containing silyl group of the following general formula (2) in one molecule, there can be obtained a cured silicone gel (gel cured product) that is excellent in surface curability and deep curability even in the presence of oxygen and is cured to a substantially definite level of crosslinking density (a substantially definite rate of penetration) irrespective of UV irradiance (irradiation energy amount).

More particularly, the invention provides the following UV curable organopolysiloxane composition including:

An ultraviolet curable organopolysiloxane composition comprising:

(A) 100 parts by weight of a linear or branched organopolysiloxane having the main chain of diorganosiloxane repeating units, the organopolysiloxane having, on average, 1 to 4 groups represented by the following general formula (1) in one molecule:

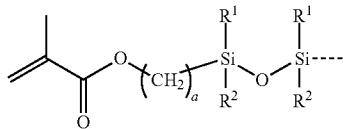
(1)

wherein $R^1$ and $R^2$ are identical or different and independently represent an unsubstituted or substituted monovalent hydrocarbon group having 1 to 10 carbon atoms, "a" is an integer of 1 to 3, and a chain line indicates a bond;

(B) 1 to 20 parts by weight of a linear or branched organopolysiloxane having the main chain of diorganosiloxane repeating units, the organopolysiloxane having at least two groups represented by the following general formula (2) in one molecule:

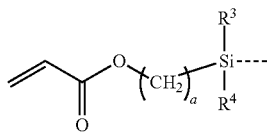
(2)

wherein $R^3$ and $R^4$ are identical or different and independently represent an unsubstituted or substituted monovalent hydrocarbon group having 1 to 10 carbon atoms, "a" is as defined above, and a chain line indicates a bond; and (C) 0.01 to 15 parts by weight of a photoinitiator.

The UV curing organopolysiloxane composition preferably further includes (D) 1 to 900 parts by weight of an organopolysiloxane of the following average compositional formula (3):

$$R^5_b SiO_{(4-b)/2} \quad (3)$$

wherein each $R^5$ is identical or different and represents an unsubstituted or substituted monovalent hydrocarbon group and b is a positive number of 1.95 to 2.05, per 100 parts by weight of the component (A).

In the ultraviolet curable organopolysiloxane composition, the component (A) is an organopolysiloxane comprising in the main chain diorganosiloxane units comprising trifluoropropylmethylsiloxane units represented by the following general formula (4):

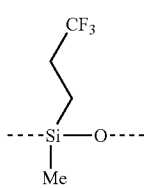
(4)

wherein Me represents a methyl group, and a chain line indicates a bond.

The invention also provides a silicone gel cured product obtained by curing the UV curable organopolysiloxane composition by irradiation of UV light, and a pressure sensor characterized by using the silicone gel cured product.

Advantageous Effects of the Invention

The UV curable organopolysiloxane composition of the invention is excellent in curability over a wide range of UV illuminance and also in surface curability and deep curability. Additionally, when UV light is irradiated, an excellent resistance to oxygen inhibition is ensured, so that much better workability over the conventional UV curable silicone compositions is obtained.

DESCRIPTION OF THE PREFERRED EMBODIMENTS

Component (A)

The component (A) used in the invention is the base component (base polymer) of the composition and is a curable one capable of being crosslinked by UV irradiation, and is particularly a linear or branched organopolysiloxane having the main chain of diorganopolysiloxane repeating units and containing on average in one molecule 1 to 4, preferably 1 to 2 and more preferably 2 groups (methacryloxyalkyl group-containing disiloxy groups) represented by the following general formula (1):

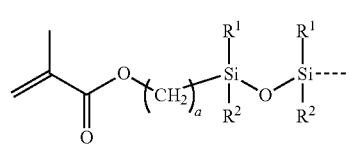
(1)

wherein $R^1$ and $R^2$ are identical or different and independently represent an unsubstituted or substituted monovalent hydrocarbon group having 1 to 10 carbon atoms, "a" is an integer of 1 to 3, and a chain line indicates a bond.

In the formula (1), $R^1$ and $R^2$ independently represent an unsubstituted or substituted monovalent hydrocarbon group preferably having 1 to 10 carbon atoms, more preferably 1 to 8 carbon atoms and not having an aliphatic unsaturated bond. Examples of the unsubstituted monovalent hydrocarbon group include an alkyl group such as methyl group, ethyl group, propyl group, isopropyl group, butyl group, isobutyl group, tert-butyl group, hexyl group, cyclohexyl group, octyl group, 2-ethylhexyl group, or decyl group, an alkenyl group such as vinyl group, allyl group, propenyl group, isopropenyl group, or butenyl group, an aryl group such as phenyl group, tolyl group, xylyl group, or naphthyl group, and an aralkyl group such as benzyl group, phenylethyl group, or phenylpropyl group. Examples of the substituted monovalent hydrocarbon group include halogen-substituted hydrocarbon groups and cyano-substituted hydrocarbon groups where part or all of the hydrogen atoms bonded to the carbon atoms of the above-indicated unsubstituted monovalent hydrocarbon groups are substituted with a halogen atom, e.g. chloromethyl group, bromoethyl group and trifluoropropyl group, or with cyano group, e.g. cyanoethyl group. Note that "a" in the formula (1) is an integer of 1, 2 or 3, preferably 2 or 3.

The group of the above general formula (1) (i.e. a methacryloxyalkyl group-containing disiloxy group) in the molecule of the organopolysiloxane component (A) may be present at the terminal of the molecular chain or at the non-terminal of the molecular chain (i.e. on the way of the molecular chain or at the side chain), or may be at both.

In the molecule of the organopolysiloxane component, organic groups bonded to the silicon atoms other than the above general formula (1) (hereinafter referred to as the organic group bonded to silicon atom) include unsubstituted or substituted monovalent hydrocarbon groups having 1 to 12, preferably 1 to 10 carbon atoms. Preferably, the organic group does not contain an aliphatic unsaturated group, as is defined in $R^1$ and $R^2$. Examples of the unsubstituted or substituted monovalent hydrocarbon group include an alkyl group such as methyl group, ethyl group, propyl group, butyl group, pentyl group, hexyl group, or heptyl group, a cycloalkyl group such as cyclohexyl group, an aryl group such as phenyl group, tolyl group, xylyl group, or naphthyl group, an aralkyl group such as benzyl group, or phenethyl group, and a halogenated alkyl group where part or all of the hydrogen atoms of the above groups are substituted with a halogen atom such as chlorine atom, fluorine atom, or bromine atom, such as chloromethyl group, 3-chloropropyl group, or 3,3,3-trifluoropropyl group. Among them, an alkyl group, an aryl group and a halogenated alkyl group, especially methyl group, phenyl group and trifluoropropyl group are preferred for synthetic simplification.

The molecular structure of the component (A) is basically a linear or branched one (including a linear structure where the main chain is partly branched) whose main chain is composed of diorganosiloxane repeating units and is preferably a linear diorganopolysiloxane blocked with the group represented by the above general formula (1) (i.e. a methacryloxyalkyl group-containing disiloxy group) at both ends of the molecular chain. The component (A) may be a homopolymer having such a molecular structure or a copolymer made of these molecular structures, or a mixture of two or more of these polymers.

The component (A) has preferably a viscosity at 25° C. of 100 to 500,000 mPa·s, more preferably 300 to 100,000 mPa·s from the viewpoint that more excellent workability of the composition and mechanical characteristics of a cured product are obtained. It will be noted that in the practice of the invention, the viscosity can be measured using a rotary viscometer (e.g. those of the BL type, BH type, BS type and cone plate type, a rheometer or the like). The range of the viscosity generally corresponds to a number average degree of polymerization of about 50 to 2,000, preferably about 100 to 1,100 for the linear organopolysiloxane. In the invention, the degree of polymerization (or molecular weight) can be determined as a number average degree of polymerization (or a number average molecular weight) when calculated as polystyrene in a gel permeation chromatography (GPC) using toluene as a developing solvent.

Specific examples of the component (A) include those represented by the following formula (5):

wherein $R^1$, $R^2$ and "a" have the same meanings as defined above, X represents oxygen atom or an alkylene group having 2 to 6 carbon atoms, $R^5$ and $R^6$ independently represent an unsubstituted or substituted monovalent hydrocarbon group having 1 to 12, preferably 1 to 10 carbon atoms, and preferably not having an aliphatic unsaturated bond, c is a number ensuring such a value of the viscosity of the organopolysiloxane as defined above.

In this case, it is preferred for $R^5$ and $R^6$ to represent an alkyl group, a cycloalkyl group, an aryl group, an aralkyl group or a halogenated alkyl group. Examples are the same as those shown in $R^1$ and $R^2$.

In the formula (5), X is preferably an alkylene group having 2 to 4 carbon atoms, and $—(SiR^5R^6—O)_c—$ has preferably trifluoropropylmethylsiloxane unit and/or diphenylsiloxane unit in addition to optional dimethylsiloxane unit represented by the following formula (6) or (7):

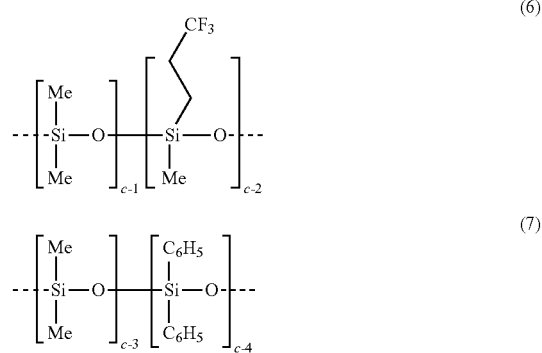

wherein (c-1) and (c-2) are integers satisfying that (c-1)≥0, (c-2)≥1 and (c-1)+(c-2)=c, and preferably (c-2)/c is 0.5 to 1.0, more preferably 0.7 to 1.0. In formula (7), (c-3) and (c-4) are integers satisfying that (c-3)≥0, (c-4)≥1 and (c-3)+(c-4)=c, and preferably (c-4)/c is 0.02 to 1.0, more preferably 0.05 to 0.3.

More specific examples include those of the following formulas.

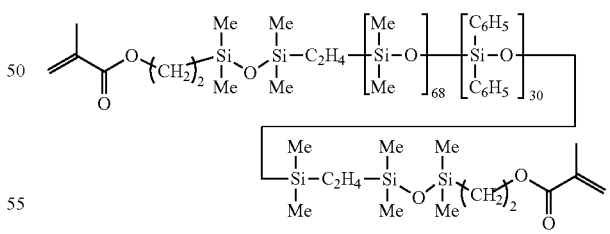

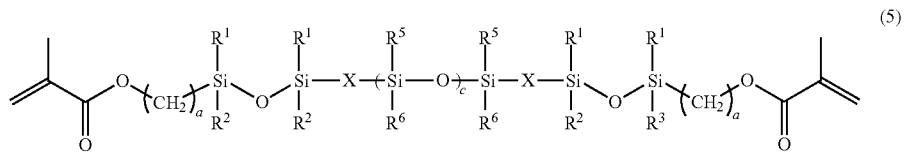

-continued

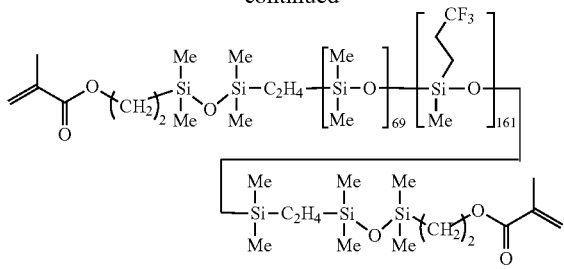

In the above formulas, Me represents methyl group and the sequence of repeating units of the main chain is random, and the respective numbers of repetitions of the dimethylsiloxane units, diphenylsiloxane units and trifluoropropylmethylsiloxane units are 0 or a positive integer arbitrarily chosen from a range satisfying a viscosity of 100 to 500,000 mPa·s, preferably 300 to 100,000 mPa·s (25° C.).

Component (B)

The component (B) used in the invention serves as a reactive diluent of the composition and is a linear or branched, relating low molecular weight (low viscosity) organopolysiloxane substantially having diorganopolysiloxane repeating units as the main chain and having on average at least two groups (acryloxyalkyl group-containing silyl group) of the following general formula (2) in the molecule. When contained in the composition, the component (B) functions as a curing sensitizer capable of sensitizing the curing reaction using radical polymerization. Thus, when the composition is cured by UV irradiation, the resistance to oxygen inhibition can be improved. The component (B) includes a hexaorganodisiloxane blocked with an acryloxyalkyl group of the following general formula (2) at both ends of the molecular chain (i.e. 1,3-bis(acryloxyalkyl)-1,1,3,3-tetraorganodisiloxane):

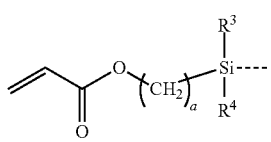 (2)

wherein $R^3$ and $R^4$ are identical or different and independently represent an unsubstituted or substituted monovalent hydrocarbon group having 1 to 10 carbon atoms, "a" is as defined above, and a chain line indicates a bond.

The viscosity of the component (B) at 25° C. is preferably 1 to 300 mPa·s, more preferably 5 to 100 mPa·s because a lower viscosity (lower molecular weight) leads to a more enhanced function as a curing sensitizer. The number average degree of polymerization of the organopolysiloxane (B) is preferably a lower degree of polymerization at approximately 2 to 200, more preferably at approximately 2 to 30.

In the formula (2), $R^3$ and $R^4$ independently represent a substituted or unsubstituted monovalent hydrocarbon group having 1 to 10 carbon atoms, preferably 1 to 8 carbon atoms and preferably not having an aliphatic unsaturated bond. The unsubstituted monovalent hydrocarbon group includes an alkyl group such as methyl group, ethyl group, propyl group, isopropyl group, butyl group, isobutyl group, tert-butyl group, hexyl group, cyclohexyl group, octyl group, 2-ethylhexyl group, or decyl group, an alkenyl group such as vinyl group, allyl group, propenyl group, isopropenyl group, or butenyl group, an aryl group such as phenyl group, tolyl group, xylyl group, or naphthyl group, and an aralkyl group such as benzyl group, phenylethyl group, or phenylpropyl group. Examples of the substituted monovalent hydrocarbon group include halogen-substituted hydrocarbon groups and cyano-substituted hydrocarbon groups where part or all of the hydrogen atoms bonded to the carbon atoms of the above-indicated unsubstituted monovalent hydrocarbon groups are substituted with a halogen atom, e.g. chloromethyl group, bromoethyl group and trifluoropropyl group, or with cyano group, e.g. cyanoethyl group. Note that "a" in formula (2) is as defined above. The group of the above general formula (2) in the molecule of the organopolysiloxane may be present at the terminal of the molecular chain or at the non-terminal of the molecular chain (i.e. on the way of the molecular chain or at the side chain), or may be at both.

In the molecule of the organopolysiloxane component (B), organic groups bonded to the silicon atoms other than the above general formula (2) include unsubstituted or substituted monovalent hydrocarbon groups and preferably not having an aliphatic unsaturated bond, as defined above as $R^3$ and $R^4$. The organic group has 1 to 12 carbon atoms, preferably 1 to 10 carbon atoms. Examples of the unsubstituted or substituted monovalent hydrocarbon group include an alkyl group such as methyl group, ethyl group, propyl group, butyl group, pentyl group, hexyl group, or heptyl group, a cycloalkyl group such as cyclohexyl group, an aryl group such as phenyl group, tolyl group, xylyl group, or naphthyl group, an aralkyl group such as benzyl group, or phenethyl group, and a halogenated alkyl group such as chloromethyl group, 3-chloropropyl group, 3,3,3-trifluoropropyl group, where part or all of the hydrogen atoms of the above-indicated groups are substituted with a halogen atom such as chlorine atom, fluorine atom, or bromine atom. Among them, an alkyl group, an aryl group and a halogenated alkyl group, especially methyl group, phenyl group or trifluoropropyl group are preferred in view of synthetic simplification, although high compatibility with the component (A) is important for the component (B).

The molecular structure of the component (B) is basically a linear or branched one (including a linear structure where the main chain is partly branched) whose main chain is composed of diorganosiloxane repeating units. The above main chain is preferably a diorganosiloxane blocked with an acryloxyalkyl group-containing silyl group represented by the general formula (2) at both ends of the molecular chain, and is more preferably a hexaorganosiloxane blocked with an acryloxyalkyl group represented by the general formula (2) at both ends of the molecular chain (i.e. 1,3-bis(acryloxyalkyl)-1,1,3,3-tetraorganodisiloxane). The component (B) may be a homopolymer having such a molecular structure or a copolymer of these molecular structures, or a mixture of two or more of these polymers.

Specific examples of the component (B) are those represented by the following formula (8):

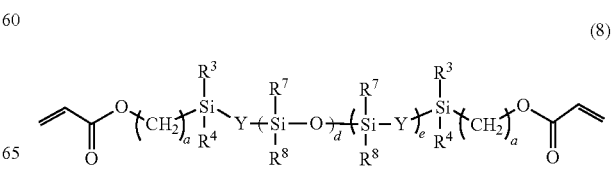 (8)

wherein $R^3$, $R^4$ and "a" are as defined above, Y represents oxygen atom or an alkylene group having 2 to 8, preferably 2 to 4 carbon atoms, $R^7$ and $R^8$ independently represent an unsubstituted or substituted monovalent hydrocarbon group having 1 to 12 carbon atoms, preferably 1 to 10 carbon atoms, and preferably not having an aliphatic unsaturated bond, d is a number enabling this organopolysiloxane to have such a viscosity as indicated above, e is 0 or 1 provided that if d is 0, e is 0 and if d is a positive number, e is 1.

In this case, $R^7$ and $R^8$ preferably represent an alkyl group, a cycloalkyl group, an aryl group, an aralkyl group or a halogenated alkyl group. Examples are the same as those shown in $R^3$ and $R^4$. Y is preferably an oxygen atom, and d is an integer of 0 to 200, preferably 0 to 30.

For the component (B), 1,3-bis(acryloxyalkyl)-1,1,3,3-tetraorganodisiloxane corresponding to the above formula (8) where d=e=0 is preferred.

To enable the sensitizing effect to be well shown, the amount of the component (B) is preferably at least about 1% by weight relative to the total weight of the components (A) and (B). If the amount of the component (B) is too lesser, its function as a sensitizer may lower due to reduced activity.

It is preferred to set an upper limit of the amount of the component (B) up to about 17% by weight, preferably up to 10% by weight, relative to the total weight of the components (A) and (B). This is for the reason that intended physical properties such as flexibility of a cured product obtained by curing the composition can be easily imparted or controlled. Accordingly, the amount of the component (B) is preferably 1 to 20 parts by weight, more preferably 2 to 11 parts by weight relative to 100 parts by weight of the component (A).

Component (C)

The photoinitiator serving as the component (C) of the composition of the invention may be ones used for the ordinary UV curable organopolysiloxane compositions. Specific examples include acetophenone, propiophenone, benzophenone, fluorine, benzaldehyde, anthraquinone, triphenylamine, carbazole, 3-methylacetophenone, 4-methylacetophenone, 3-pentylacetophenone, 4-methoxyacetophenone, 3-bromoacetophenone, 4-allylacetophenone, p-diacetylbenzene, 3-methoxybenzophenone, 4-methylbenzophenone, 4-chlorobenzophenone, 4,4'-dimethoxybenzophenone, 2,2'-diethoxyacetophenone, 4-chloro-4'-benzylbenzophenone, 3-chloroxanthone, 3,9-dichloroxanthone, 3-chloro-8-nonylxanthone, benzoin, benzoin methyl ether, benzoin butyl ether, bis(4-dimethylaminophenyl)ketone, benzyl methoxy ketal, 2-chlorothioxanthone, diethylacetophenone, 1-hydroxycyclohexyl phenyl ketone, 2-methyl-1 [4-(methylthio)phenyl]-2-morpholino-1-one, 2-benzyl-2-dimethylamino-1-(4-morpholinophenyl)-butanone, 1-[4-(2-hydroxyethoxy)phenyl]-2-methyl-1-propan-1-one, 2,2-dimethoxy-2-phenylacetophenone, 2-hydroxy-2-methyl-1-phenylpropan-1-one, cyclohexyl phenyl ketone, and the like.

The amount of the component (C) is about 0.01 to 10% by weight, preferably 0.05 to 8% by weight and more preferably approximately 0.1 to 5% by weight relative to the total weight of the composition (especially, relative to the total weight of the components (A) to (C)). If the amount of the component (C) is too small, its effect of addition is not shown. On the other hand, if the amount is too large, the resulting cured product is significantly influenced by the decomposited residue of the component (C) and thus, the physical characteristics of the cured product become worsened. Accordingly, the amount of the component (C) is 0.01 to 15 parts by weight, preferably 0.05 to 10 parts by weight, more preferably 0.05 to 8 parts by weight and much more preferably 0.1 to 6 parts by weight relative to 100 parts by weight of the component (A).

Component (D)

The component (D) in the composition of the invention is an arbitrary component capable of being formulated if required and acts as a plasticizer for adjusting the viscosity of the composition or the hardness of a silicone gel (gel cured product) obtained by curing the composition.

The component (D) is an organopolysiloxane represented by the following average compositional formula (3):

wherein each $R^5$ is identical or different and represents an unsubstituted or substituted monovalent hydrocarbon group, and b is a positive number of 1.95 to 2.05.

In the above formula (3), the unsubstituted or substituted monovalent hydrocarbon group having 1 to 10 carbon atoms and represented by $R^5$ includes an alkyl group such as methyl group, ethyl group, propyl group, isopropyl group, butyl group, isobutyl group, tert-butyl group, hexyl group, octyl group, or 2-ethylhexyl group, a cycloalkyl group such as cyclohexyl group, an alkenyl group such as vinyl group, allyl group, propenyl group, isopropenyl group, butenyl group, or hexenyl group, an aryl group such as phenyl group, or tolyl group, an aralkyl group such as benzyl group, or phenethyl group, and a group where part or all of the hydrogen atoms of the above groups are partially substituted with a halogen atom such as chlorine atom, fluorine atom, bromine atom, e.g. trifluoropropyl group or the like. For synthetic simplification, methyl group, phenyl group and trifluoropropyl group are preferred.

The molecular structure of the component (D) is not critical, and includes a linear, cyclic, branched, linear but partially with a branch, or a dendrimer structure. Preferably, a linear structure with or without a partial branch is preferred. More preferably, mention is made of a linear diorganopolysiloxane blocked at both ends of the molecular chain with a triorganosiloxy group such as a trimethylsiloxy group or a dimethylvinylsiloxy group, or a silanol group (i.e. a hydroxyl group bonded to the silicon atom) and the main chain of the diorganopolysiloxane is one or more types of repetitions of diorganosiloxane units such as a trifluoropropylmethylsiloxane unit, a dimethylsiloxane unit, a diphenylsiloxane unit, or a methylphenylsiloxane unit. The component (D) may be a homopolymer having such a molecular structure as mentioned above, a copolymer of these molecular structures, or a mixture of these polymers.

The viscosity of this component (D) at 25° C. is preferably 100 to 500,000 mPa·s, more preferably 300 to 100,000 mPa·s, within which more excellent results are obtained with respect to the workability of the resulting composition and mechanical characteristics of a cured product. The above-indicated range of viscosity corresponds generally to a number average degree of polymerization of about 50 to 2,000, preferably about 100 to 1,100 for a linear organopolysiloxane.

The amount of the component (D) is generally within a range of at least 900 parts by weight (0 to 900 parts by weight) relative to 100 parts by weight of the component (A). If formulated, its amount is preferably at 1 to 900 parts by weight, more preferably at 100 to 800 parts by weight and much more preferably at 200 to 600 parts by weight.

In the composition of the invention, aside from the above-stated components (A) to (C) (or the components (A) to (D) in some cases), other arbitrary components may be added within ranges not impeding the effect of the invention. Such components include, for example, silica fillers not impeding the UV-curing reaction such as fumed silica, silicone rubber powders, extenders such as calcium carbonate, adhesion imparting agents contributing to improving adhesiveness or stickiness such as alkoxyorganosilane, heat-resistant additives, flame retardance-imparting agents, and the like.

The composition of the invention can be obtained by uniformly mixing given amounts of the components (A) to (D) and other arbitrary components.

Where the composition of the invention is cured, UV irradiation is used. Effective UV light for this purpose is one having a wavelength of 250 to 450 nm, preferably 250 to 380 nm and an irradiance level is at 1,000 to 10,000 mJ/cm$^2$, preferably at 2,000 to 5,000 mJ/cm$^2$. It will be noted that the curing temperature may be room temperature and is generally at 25° C.±10° C.

The cured product of the composition of the invention is usually a silicone gel, which has a rate of penetration of 10 to 150, preferably 30 to 130 when determined according to a testing method defined in JIS K 2220 (¼ cone).

The cured product of the composition of the invention (silicone gel) has utility in many applications and is particularly conveniently employed at a portion of sealing a sensor body (semiconductor device) of a pressure sensor.

EXAMPLES

The invention is particularly described by way of Examples and Comparative Examples, which should not be construed as limiting the invention to the Examples. It will be noted that, in the following Examples, parts are by weight and Me stands for a methyl group. The viscosity is a measurement determined by a rotary viscometer at 25° C.

Component (A)

(A-1) Linear trifluoropropylmethylsiloxane/-dimethylsiloxane copolymer represented by the following formula (9) which has a methacryloxypropyl group-containing disiloxy group, in one molecule, at both ends of the molecular chain and the main chain of repetitions of trifluoropropylmethylsiloxane units and dimethylsiloxane units, and has a viscosity of 5,000 mPa·s:

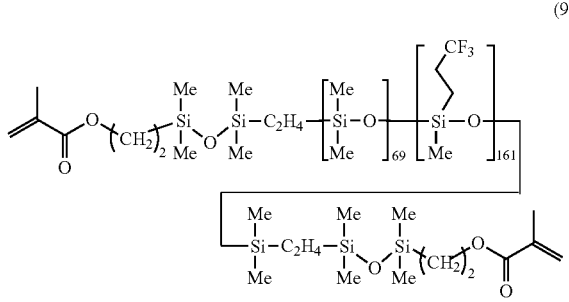

(9)

Component (B)

(B-1) 1,3-bis(acryloxymethyl)-1,1,3,3-tetramethyl-disiloxane represented by the following formula (10)

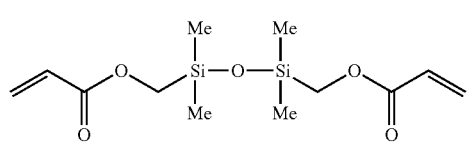

(10)

(B-2) 1,3-bis(methacryloxypropyl)-1,1,3,3-tetramethyl-disiloxane represented by the following formula (11)

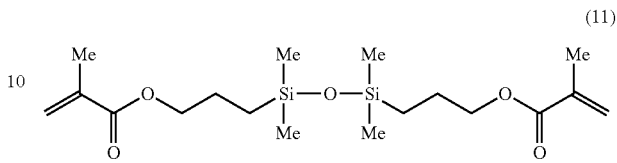

(11)

(B-3) 2-hydroethyl acrylate, manufactured by Osaka Organic Chemical Industry Ltd.

Component (C)

(C-1) Darocur 1173, manufactured by BASF Japan Ltd.

(C-2) 2,2-diethoxyacetophenone, manufactured by Tokyo Chemical Industry Co., Ltd.

Component (D)

(D-1) Linear trifluoropropylmethylsiloxane/-dimethylsiloxane copolymer, which is blocked with a dimethylvinylsiloxy group at both ends of the molecular chain, has the main chain of repetitions of trifluoropropylmethylsiloxane units and dimethylsiloxane units, and has a viscosity of 5,000 mPa·s.

Examples 1 and 2, and Comparative Examples 1 to 4

The above components (A) to (D) were formulated as indicated in Table 1 and mixed to prepare silicone compositions S1 to S6. The thus prepared silicone compositions S1 to S6 were each cured by irradiating UV light at room temperature (25° C.) in an atmosphere of air by use of Eye UV electronic controller (Model UBX0601-01, made by Eye Graphics Co., Ltd.) in such a way that the irradiance level of the UV light having a wavelength of 365 nm was at 5,000 mJ/cm$^2$. The results of a rate of penetration and surface curability are shown in Table 1. It will be noted that the rate of penetration was determined according to a testing method defined in JIS K2220 (¼ cone). As to the surface curability, a tackiness-free surface of cured product was evaluated as ○ (good), a tacky surface was evaluated as Δ (poor), and a product permitting an uncured oil to bleed out was evaluated as × (bad).

TABLE 1

| | | Example | | Comparative Example | | | |
|---|---|---|---|---|---|---|---|
| | | 1 | 2 | 1 | 2 | 3 | 4 |
| Silicone composition | | S1 | S2 | S3 | S4 | S5 | S6 |
| Formulation | (A-1) | 20 | 20 | 20 | 20 | 20 | 20 |
| amount | (B-1) | 3.0 | 3.0 | — | — | — | — |
| (parts by weight) | (B-2) | — | — | 3.0 | 3.0 | — | — |
| | (B-3) | — | — | — | — | 3.0 | 3.0 |
| | (C-1) | 2.0 | — | 2.0 | — | 2.0 | — |
| | (C-2) | — | 2.0 | — | 2.0 | — | 2.0 |
| | (D-1) | 80 | 80 | 80 | 80 | 80 | 80 |

TABLE 1-continued

| | Example | | Comparative Example | | | |
|---|---|---|---|---|---|---|
| | 1 | 2 | 1 | 2 | 3 | 4 |
| Rate of penetration | 53 | 56 | Not cured | Not cured | 48 | 52 |
| Surface curability | ○ | ○ | X | X | Δ | Δ |

The silicone compositions S1 and S5 were used and cured at different irradiance levels so as to measure a rate of penetration. The results are shown in Table 2.

TABLE 2

| | | Example 1 | Comparative Example 3 |
|---|---|---|---|
| Silicone composition | | S1 | S5 |
| UV irradiance level | 1,000 | 72 | 81 |
| (@365 nm, mJ/cm$^2$) | 2,000 | 56 | 67 |
| | 2,500 | 55 | 61 |
| | 5,000 | 53 | 48 |
| | 10,000 | 52 | 46 |

From the results of Table 2, it was revealed that Example 1 could more stably provide a gel cured product having a substantially constant rate of penetration (i.e. a substantially constant crosslinking density) than Comparative Example 3 irrespective of the UV irradiance level (irradiation energy level).

Japanese Patent Application No. 2014-186266 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An ultraviolet curable organopolysiloxane composition comprising:
(A) 100 parts by weight of a linear diorganopolysiloxane blocked with the methacryloxyalkyl group-containing disiloxy group represented by the following general formula (1) at both ends of the molecular chain:

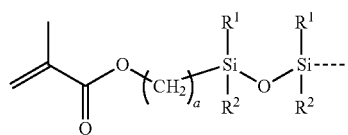

(1)

wherein $R^1$ and $R^2$ are identical or different and independently represent an unsubstituted or substituted monovalent hydrocarbon group having 1 to 10 carbon atoms, "a" is an integer of 1 to 3, and a chain line indicates a bond;

(B) 1 to 20 parts by weight of a 1,3-bis(acryloxyalkyl)-1,1,3,3-tetraorganodisiloxane represented by the following general formula (8)':

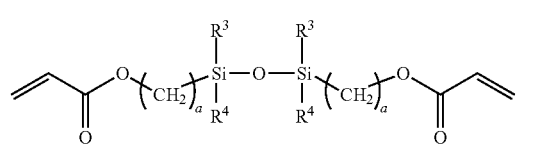

(8)' wherein $R^3$ and $R^4$ are identical or different and independently represent an unsubstituted or substituted monovalent hydrocarbon group having 1 to 10 carbon atoms, "a" is as defined above, and
(C) 0.01 to 15 parts by weight of a photoinitiator.

2. The ultraviolet curable organopolysiloxane composition of claim 1, further comprising
(D) 1 to 900 parts by weight of an organopolysiloxane of the following average compositional formula (3):

$$R^5_b SiO_{(4-b)/2} \quad (3)$$

wherein each $R^5$ is identical or different and represents an unsubstituted or substituted monovalent hydrocarbon group and "b" is a positive number of 1.95 to 2.05, per 100 parts by weight of the component (A).

3. The ultraviolet curable organopolysiloxane composition of claim 1, wherein the component (A) is an organopolysiloxane comprising in the main chain diorganosiloxane units comprising trifluoropropylmethylsiloxane units represented by the following general formula (4):

(4)

wherein Me represents a methyl group, and a chain line indicates a bond.

4. A silicone gel cured product obtained by curing the ultraviolet curable organopolysiloxane composition of claim 1 by irradiation of ultraviolet light.

5. A pressure sensor characterized by using the silicone gel cured product of claim 4.

6. The ultraviolet curable organopolysiloxane composition of claim 1, wherein the component (A) is a linear diorganopolysiloxane blocked with the methacryloxyalkyl group-containing disiloxy group at both ends of the molecular chain, represented by the following general formula (5):

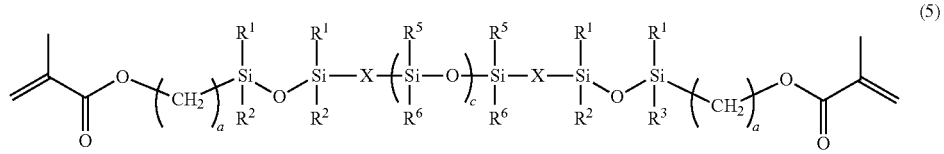

(5)

wherein $R^1$, $R^2$ and "a" have the same meanings as defined above, X represents oxygen atom or an alkylene group having 2 to 6 carbon atoms, $R^3$ and $R^6$ independently represent an unsubstituted or substituted monovalent hydrocarbon group having 1 to 12 carbon atoms, and "c" is an integer of 1 or more, ensuring that a value of a viscosity at 25° C. of the component (A) is 100 to 500,000 mPa·s.

* * * * *